(12) United States Patent
Su et al.

(10) Patent No.: US 9,407,089 B2
(45) Date of Patent: Aug. 2, 2016

(54) ELECTRICAL DISCHARGE PROTECTION CIRCUIT AND METHOD OF USE

(71) Applicant: TAIWAN SEMICONDUCTOR MANUFACTURING COMPANY, LTD., Hsinchu (TW)

(72) Inventors: Yu-Ti Su, Tainan (TW); Chia-Wei Hsu, New Taipei (TW); Jen-Chou Tseng, Jhudong Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/446,675

(22) Filed: Jul. 30, 2014

(65) Prior Publication Data

US 2016/0036217 A1    Feb. 4, 2016

(51) Int. Cl.
*H02H 9/04*    (2006.01)

(52) U.S. Cl.
CPC ........................................ *H02H 9/04* (2013.01)

(58) Field of Classification Search
CPC .......................................................... H02H 9/04
See application file for complete search history.

(56) References Cited

U.S. PATENT DOCUMENTS 6,249,410 B1 *   6/2001   Ker ..................... H01L 27/0251
                                                                 361/111

* cited by examiner

*Primary Examiner* — Mamadou Diallo
(74) *Attorney, Agent, or Firm* — Hauptman Ham, LLP

(57) ABSTRACT

A circuit includes a driver circuit between a first and second power supply nodes, and a first and second electrostatic discharge (ESD) protection circuits. The driver circuit is configured to generate a pair of differential signals at a first output node and a second output node. The first ESD protection circuit is coupled between the first output node and the second power supply node. The first ESD protection circuit includes a first transistor, and the first transistor includes a drain region and a source region in a well region. The second ESD protection circuit is coupled between the second output node and the second power supply node. The second ESD protection circuit includes a second transistor, and the second transistor includes a drain region and a source region in the well region.

20 Claims, 7 Drawing Sheets

US 9,407,089 B2

ELECTRICAL DISCHARGE PROTECTION CIRCUIT AND METHOD OF USE

BACKGROUND

An electrostatic discharge (ESD) event refers to a momentary electrical surge causing a current flow to, from, or within a circuit. The momentary electrical surge often causes an excessive amount of current or voltage, which may cause damage to the circuit. Many electrical circuits and devices are susceptible to damage caused by ESD events. ESD protection circuits are usually implemented in a chip to protect the devices and circuits on the chip from ESD damage. Operations of ESD protection circuits generally include one or a combination of the following mechanisms: dissipating an ESD induced current using a low-impedance discharging path, clamping an ESD induced voltage to a predetermined safe level, and similar mechanisms. In some applications, the low-impedance discharge path for the ESD induced current is activated responsive to an ESD event, but is deactivated (e.g., becomes a high-impedance path) during a normal operation of the to-be protected circuit in the absence of the ESD event.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
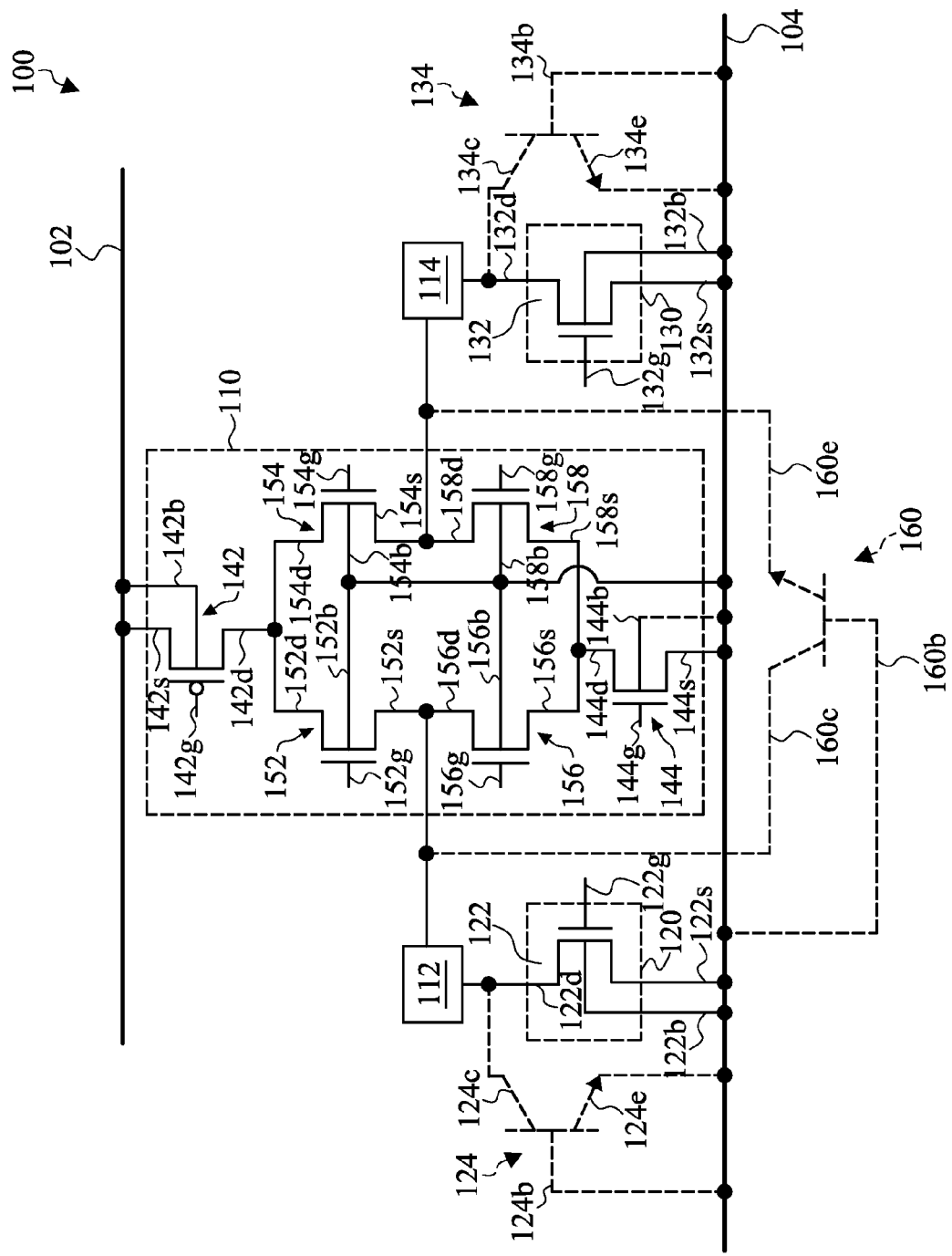
FIG. 1 is a circuit diagram of a portion of a circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, output nodes of a driver circuit are coupled with corresponding ESD protection circuits. In some embodiments, each one of the ESD protection circuits includes a transistor connecting a corresponding output node to a power supply node. In some embodiments, the drain regions of the transistors of the ESD protection circuits are in the same well region. As a result, a parasitic bipolar junction transistor (BJT) is defined by the drain regions of the transistors of the ESD protection circuits and the well region. The parasitic BJT is capable of providing a discharge path between the output nodes of the driver circuit responsive to an ESD event.

FIG. 1 is a circuit diagram of a portion of a circuit 100 in accordance with some embodiments. Circuit 100 includes a first power supply node 102, a second power supply node 104, a driver circuit 110 between first power supply node 102 and second power supply node 104, and a set of ESD protection circuits including a first ESD protection circuit 120 and a second ESD protection circuit 130. In some embodiments, first power supply node 102 is configured to receive a first power supply voltage, and second power supply node 104 is configured to receive a second power supply voltage. In some embodiments, a voltage level of the second power supply voltage is used as a ground reference level, and a voltage level of the first power supply voltage is greater than the ground reference level.

Driver circuit 110 includes a first output node 112 and a second output node 114. Driver circuit 110 is configured to generate a pair of differential signals at first output node 112 and second output node 114. Driver circuit 110 includes a P-type transistor 142 and N-type transistors 144, 152, 154, 156, and 158.

A source terminal 142s of transistor 142 is coupled with first power supply node 102; a drain terminal 142d of transistor 142 is coupled with a drain terminal 152d of transistor 152 and a drain terminal 154d of transistor 154; and a bulk 142b of transistor 142 is coupled with first power supply node 102. A gate 142g of transistor 142 is configured to receive a first biasing voltage such that transistor 142 is used as a first current source for driver circuit 110 during operation of driver circuit 110 to generate the pair of differential signals.

A source terminal 144s of transistor 144 is coupled with second power supply node 104; a drain terminal 144d of transistor 144 is coupled with a source terminal 156s of transistor 156 and a source terminal 158s of transistor 158; and a bulk 144b of transistor 144 is coupled with second power supply node 104. A gate 144g of transistor 144 is configured to receive a second biasing voltage such that transistor 144 is used as a second current source for driver circuit 110 during operation of driver circuit 110 to generate the pair of differential signals.

A source terminal 152s of transistor 152 is coupled with a drain terminal 156d of transistor 156 and first output node 112. A source terminal 154s of transistor 154 is coupled with a drain terminal 158d of transistor 158 and second output node 114. Bulk terminals 152b, 154b, 156b, and 158b are coupled with second power supply node 104. Gate terminals 152g, 154g, 156g, and 158g are configured to receive various control signals in order to generate the pair of differential signals accordingly.

Driver circuit 110 is a low-voltage differential signaling (LVDS) driver circuit and is illustrated as an example. In some embodiments, driver circuit 110 is usable in applications other than LVDS applications. In some embodiments, driver circuit 110 is replaceable with other types of LVDS driver circuits or differential driver circuits. Moreover, the channel types of transistors 142, 144, 152, 154, 156, and 158 advanced above are just an example. In some embodiments, driver circuit 110 has a different configuration and thus the number, the channel types, and the connections of transistors 142, 144, 152, 154, 156, and 158 vary.

First ESD protection circuit 120 is coupled between first output node 112 and second power supply node 104. First ESD protection circuit 120 includes an N-type transistor 122. A source terminal 122s of transistor 122 is coupled with second power supply node 104; a drain terminal 122d of transistor 122 is coupled with first output node 112; and a bulk terminal 122b of transistor 122 is also coupled with second power supply node 104. A gate terminal 122g of transistor 122 is configured to receive a third biasing voltage such that transistor 122 is turned off during operation of driver circuit 110 to generate the pair of differential signals.

Transistor 122 has a drain region (e.g., doped regions 332a and 332c in FIGS. 3A and 3B) coupled with drain terminal 122d and a source region (e.g., doped regions 332b and 336a-336c in FIGS. 3A and 3B) coupled with source terminal 122s. The drain region and the source region of transistor 122 are formed in a P-type well region (e.g., well region 320 in FIGS. 3A and 3B). The well region is further coupled with bulk terminal 122b and second power supply node 104. The drain region of first transistor 122, the well region, and the source region of first transistor 122 define a first parasitic NPN bipolar junction transistor (BJT) 124. First parasitic BJT 124 has a collector terminal 124c coupled with first output node 112 and an emitter terminal 124e and a base terminal 124b coupled with second power supply node 104. In some embodiments, responsive to various direct current (DC) biasing conditions of first parasitic BJT 124, terminal 124c functions as an emitter terminal and terminal 124e functions as a collector terminal of first parasitic BJT 124.

Second ESD protection circuit 130 is coupled between second output node 114 and second power supply node 104. Second ESD protection circuit 130 includes an N-type transistor 132. A source terminal 132s of transistor 132 is coupled with second power supply node 104; a drain terminal 132d of transistor 132 is coupled with second output node 114; and a bulk terminal 132b of transistor 132 is also coupled with second power supply node 104. A gate terminal 132g of transistor 132 is configured to receive a fourth biasing voltage such that transistor 132 is turned off during operation of driver circuit 110 to generate the pair of differential signals.

Transistor 132 has a drain region (e.g., doped regions 334a and 334c in FIGS. 3A and 3B) coupled with drain terminal 132d and a source region (e.g., doped regions 334b and 336a-336c in FIGS. 3A and 3B) coupled with source terminal 132s. The drain region and the source region of transistor 132 are also formed in the same P-type well region (e.g., well region 320) as the drain region and the source region of transistor 122. The drain region of first transistor 132, the well region, and the source region of first transistor 132 define a second parasitic NPN BJT 134. Second parasitic BJT 134 has a collector terminal 134c coupled with second output node 114 and an emitter terminal 134e and a base terminal 134b coupled with second power supply node 104. In some embodiments, responsive to various DC biasing conditions of second parasitic BJT 134, terminal 134c functions as an emitter terminal and terminal 134e functions as a collector terminal of second parasitic BJT 134.

Moreover, the drain region of first transistor 122, the well region, and the drain region of second transistor 132 define a third parasitic NPN BJT 160. Third parasitic BJT 160 has a collector terminal 160c coupled with first output node 112, an emitter terminal 160e coupled with second output node 114, and a base terminal 160b coupled with second power supply node 104. In some embodiments, responsive to various DC biasing conditions of third parasitic BJT 160, terminal 160c functions as an emitter terminal and terminal 160e functions as a collector terminal of third parasitic BJT 160.

Figure 2:
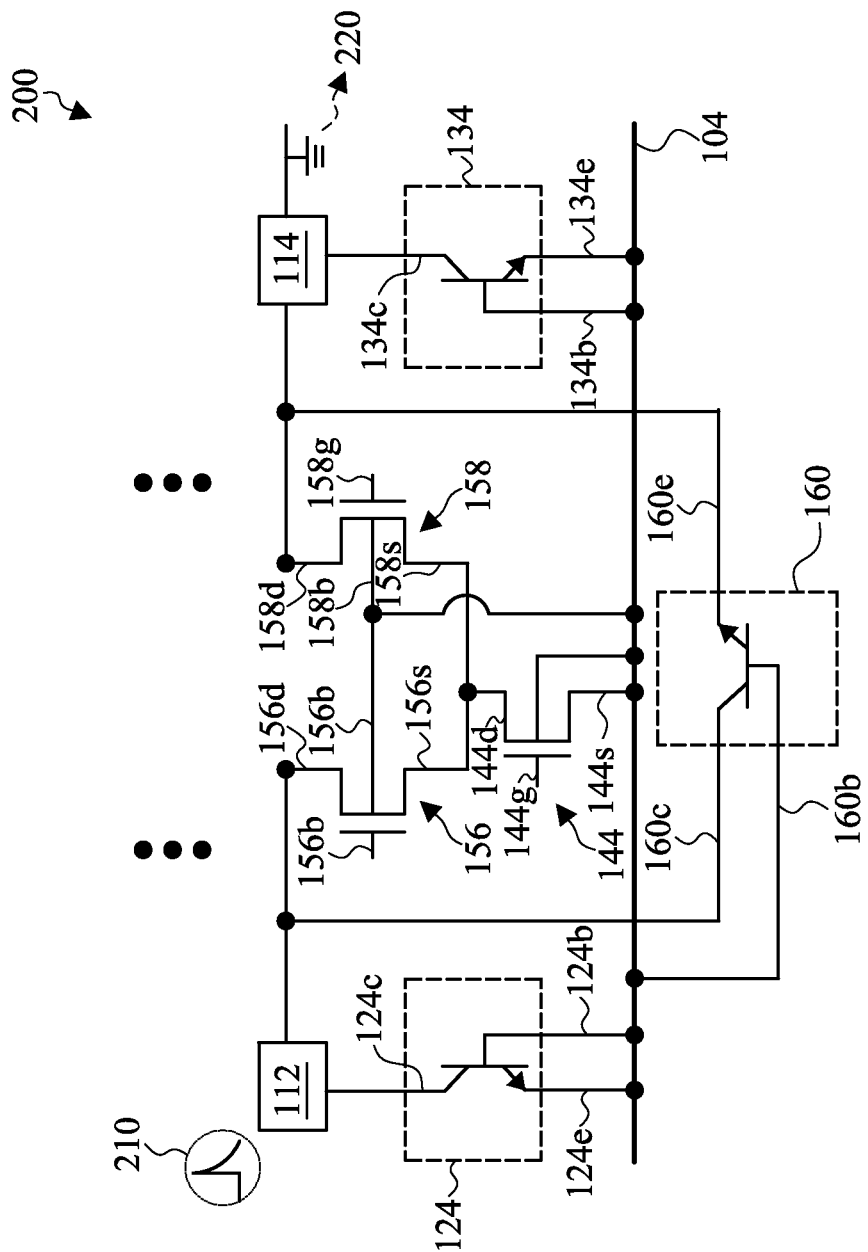
FIG. 2 is a circuit diagram of an equivalent circuit of a portion of a circuit under an ESD event in accordance with some embodiments.

FIG. 2 is a circuit diagram of an equivalent circuit 200 of a portion of a circuit, such as circuit 100 in FIG. 1, under an ESD event in accordance with some embodiments. The components in FIG. 2 that are the same or similar to those in FIG. 1 are given the same reference numbers, and the detailed description thereof is thus omitted.

In some applications, a particular type of ESD event includes applying an electrical surge 210 first input node 112 and dissipating such electrical surge 210 from second input node 114, as indicated as coupled to a ground node 220. Under this type of ESD event, second power supply node 104 is deemed as floating. Responsive to the electrical surge 210, various ESD protection circuits electrically couples first input node 112 and second input node 114 such that the electrical surge 210 is not going to be dissipated through the electrical components of the driver circuit 110, such as transistors 156, 158, and/or 144.

For example, responsive to the electrical surge 210, a first electrical path between first input node 112 and second input node 114 is activated by turning on parasitic BJT 160. A PN junction between collector terminal 160c and base terminal 160b operates in an avalanche mode responsive to electrical surge 210. As a result, a voltage level at second power supply node 104 begins to be pulled toward the voltage level at first input node 112. Then, a PN junction between base terminal 160b and emitter terminal 160e operates in a forward-biased mode. Accordingly, parasitic BJT 160 is turned on and the first electrical path between first input node 112 and second input node 114 through parasitic BJT 160 is activated.

Furthermore, responsive to the electrical surge 210, a second electrical path between first input node 112 and second input node 114 is activated by turning on parasitic BJT 124 and through a portion of parasitic BJT 134. A PN junction between collector terminal 124c and base terminal 124b operates in the avalanche mode responsive to electrical surge 210. Also, a PN junction between base terminal 124b and emitter terminal 124e operates in the forward-biased mode. As a result, parasitic BJT 124 is turned on. In addition, a PN junction between base terminal 134b and emitter terminal 134e operates in the forward-biased mode. Accordingly, the second electrical path between first input node 112 and second input node 114 through parasitic BJT 124 and the PN junction between base terminal 134b and emitter terminal 134e is activated.

In some applications, an alternative configuration of circuit 100 is implemented by having the drain and source regions of transistor 122 formed in a P-type well region, and the drain and source regions of transistor 132 are formed in another P-type well region. Because of the lack of the common well region between transistor 122 and transistor 132, such alternative configuration does not have a structure equivalent to parasitic BJT 160. Rather, in such configuration, dissipation of the electrical surge 210 depends solely on a conductive path equivalent to the second electrical path illustrated above.

Compared with such alterative configuration, the embodiments according to the present application further offer an additional electrical path (e.g., the first electrical path illustrated above) and thus effectively reduce the voltage level of the second supply node 104 that would be pulled up responsive to the electrical surge 210 and the time period the electrical surge 210 is dissipated to ground node 220. In some applications, the higher the voltage level of the second supply node 104 is and the longer the dissipation of the electrical surge 210 takes, the risk of turning on parasitic NPN BJT defined by drain terminal 156d, bulk terminal 156b, and source terminal 156s and parasitic NPN BJT defined by drain terminal 158d, bulk terminal 158b, and source terminal 158s increases. If such two parasitic NPN BJTs associated with transistors 156 and 158 were turned on, electrical surge 210 is also dissipated through such parasitic NPN BJTs. In many applications, transistors 156 and 158 are not designed to endure the ESD induced current and thus are susceptible to be damaged if such parasitic NPN BJTs were turned on. Therefore, if such two parasitic NPN BJTs associated with transistors 156 and 158 were turned on, transistors 156 and 158 are likely to be damaged by the ESD surge 210.

Accordingly, compared with such alterative configuration advanced above, one or more embodiments according to the present application further offer the additional electrical path by turning on parasitic BJT 160 such that the risk of turning on the parasitic BJTs associated with transistors 156 and 158 is reduced. Therefore, the risk of damaging transistors 156 and 158 upon occurrence of the ESD surge 210 is reduced.

Figure 3A:
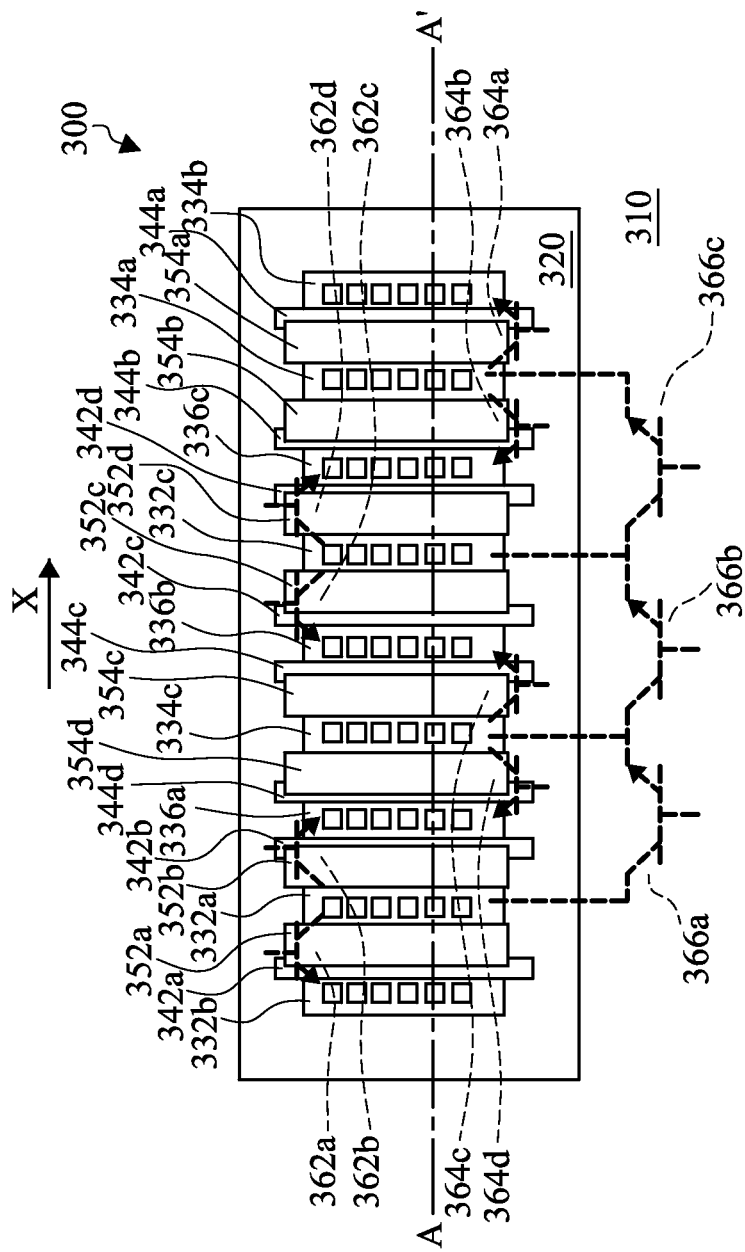
FIG. 3A is a top view of a portion of a semiconductor structure corresponding to a set of ESD protection circuits usable in conjunction with a driver circuit in accordance with some embodiments.
Figure 3B:
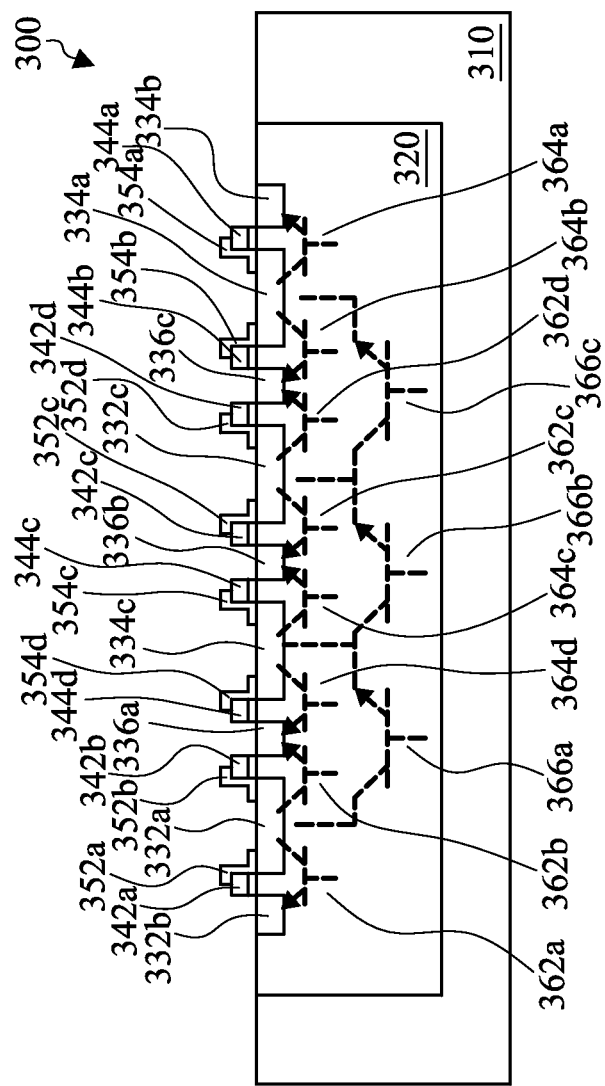
FIG. 3B is a cross-sectional view of the semiconductor structure corresponding to the set of ESD protection circuits of FIG. 3A taken along reference line AA' in accordance with some embodiments.

FIG. 3A is a top view of a portion of a semiconductor structure 300 corresponding to a set of ESD protection circuits usable in conjunction with a driver circuit in accordance with some embodiments. FIG. 3B is a cross-sectional view of the semiconductor structure 300 corresponding to the set of ESD protection circuits of FIG. 3A taken along reference line AA' in accordance with some embodiments. In some embodiments, the set of ESD protection circuits includes first ESD protection circuit 120 and second ESD protection circuit 130 in circuit 100.

Semiconductor structure 300 includes a substrate 310 and a driver circuit (not shown) over the substrate 310. In some embodiments, the driver circuit corresponds to driver circuit 110 in FIG. 1. In some embodiments, the driver circuit includes a first conductive structure corresponds to first output node 112 and a second conductive structure corresponds to second output node 114.

Semiconductor structure 300 further includes a P-type well region 320 over substrate 310, and N-type doped regions 332a, 332b, 332c, 334a, 334b, 334c, 336a, 336b, and 336c in the well region 310. Doped regions 332a, 332b, 332c, 334a, 334b, 334c, 336a, 336b, and 336c are arranged in a single row. In some embodiments, there are two or more rows of N-type doped regions similar to N-type doped regions 332a, 332b, 332c, 334a, 334b, 334c, 336a, 336b, and 336c in the well region 310.

Semiconductor structure 300 further includes gate structures 342a, 342b, 342c, 342d, 344a, 344b, 344c, and 344d over substrate 310. Gate structure 342a is between doped regions 332b and 332a; gate structure 342b is between doped regions 332a and 336a; gate structure 342c is between doped regions 336b and 332c; and gate structure 342d is between doped regions 332c and 336c. Gate structure 344a is between doped regions 334b and 334a; gate structure 344b is between doped regions 334a and 336c; gate structure 344c is between doped regions 336b and 334c; and gate structure 344d is between doped regions 334c and 336c.

Gate structures 342a, 342b, 342c, and 342d correspond to the gate terminal of a first transistor, such as transistor 122 in FIG. 1. The N-type doped regions include four subsets, where a first and second subsets thereof correspond to the first transistor 122. The first subset of the doped regions includes doped regions 332b, 336a, 336b, and 336c and is configured as a source region of the first transistor 122. The second subset of the doped regions includes doped regions 332a and 332c and is configured a drain region of the first transistor 122.

Furthermore, gate structures 344a, 344b, 344c, and 344d correspond to the gate terminal of a second transistor, such as transistor 132 in FIG. 1. The second and third sets of the four subsets of doped regions correspond to the second transistor 132. The third subset of the doped regions includes doped regions 334b, 336a, 336b, and 336c and is configured as a source region of the second transistor 132. The fourth subset of the doped regions includes doped regions 334a and 334c and is configured a drain region of the second transistor 132.

The first and third sets of the four subsets have at least one doped region in common, such as doped regions 336a, 336b, and 336c. In some embodiments, the first and third sets of the four subsets have no doped region in common.

Moreover, the second subset of the doped regions is electrically coupled with the first conductive structure (hence, e.g., first output node 112); and the fourth subset of the doped regions is electrically coupled with the second conductive structure (hence, e.g., second output node 114).

In addition, semiconductor structure 300 includes Resist-Protection-Oxide (RPO) structures 352a, 352b, 352c, 352d, 354a, 354b, 354c, and 354d partially over gate structures 342a, 342b, 342c, 342d, 344a, 344b, 344c, and 344d, respectively, and extending to corresponding drain regions in order to increase a gate-drain breakdown voltage of the corresponding transistor. In some embodiments, some or all of RPO structures 352a, 352b, 352c, 352d, 354a, 354b, 354c, and 354d are omitted.

In some embodiments in which there are two or more rows of N-type doped regions in the well region 310, each row of the one or more rows of doped regions includes doped regions of the first, second, third, and fourth subsets of the doped regions.

Furthermore, doped regions 332b, well region 320, and doped region 332a defines a parasitic NPN BJT 362a; doped regions 336a, well region 320, and doped region 332a defines a parasitic NPN BJT 362b; doped regions 336b, well region 320, and doped region 332c defines a parasitic NPN BJT 362c; doped regions 336c, well region 320, and doped region 332c defines a parasitic NPN BJT 362d. In some embodiments, parasitic BJTs 362a-362d collectively correspond to parasitic BJT 124 in FIG. 1. Doped regions 334b, well region 320, and doped region 334a defines a parasitic NPN BJT 364a; doped regions 336c, well region 320, and doped region 334a defines a parasitic NPN BJT 364b; doped regions 336b, well region 320, and doped region 334c defines a parasitic NPN BJT 364c; doped regions 336a, well region 320, and doped region 334c defines a parasitic NPN BJT 364d. In some embodiments, parasitic BJTs 364a-364d collectively correspond to parasitic BJT 134 in FIG. 1.

Because doped regions 332a, 332c, 334a, and 334c are in the same well region 320, doped regions 332a, well region 320, and doped region 334c defines a parasitic NPN BJT 366a; doped regions 332c, well region 320, and doped region 334c defines a parasitic NPN BJT 366b; and doped regions 332c, well region 320, and doped region 334a defines a parasitic NPN BJT 366c. In some embodiments, parasitic BJTs 366a-366c collectively correspond to parasitic BJT 160 in FIG. 1.

In some embodiments, responsive to various DC biasing conditions of parasitic BJTs 366a-366c, the positions of the emitter terminals and the collector terminals thereof are the opposite of those depicted in FIGS. 3A and 3B.

Figure 4:
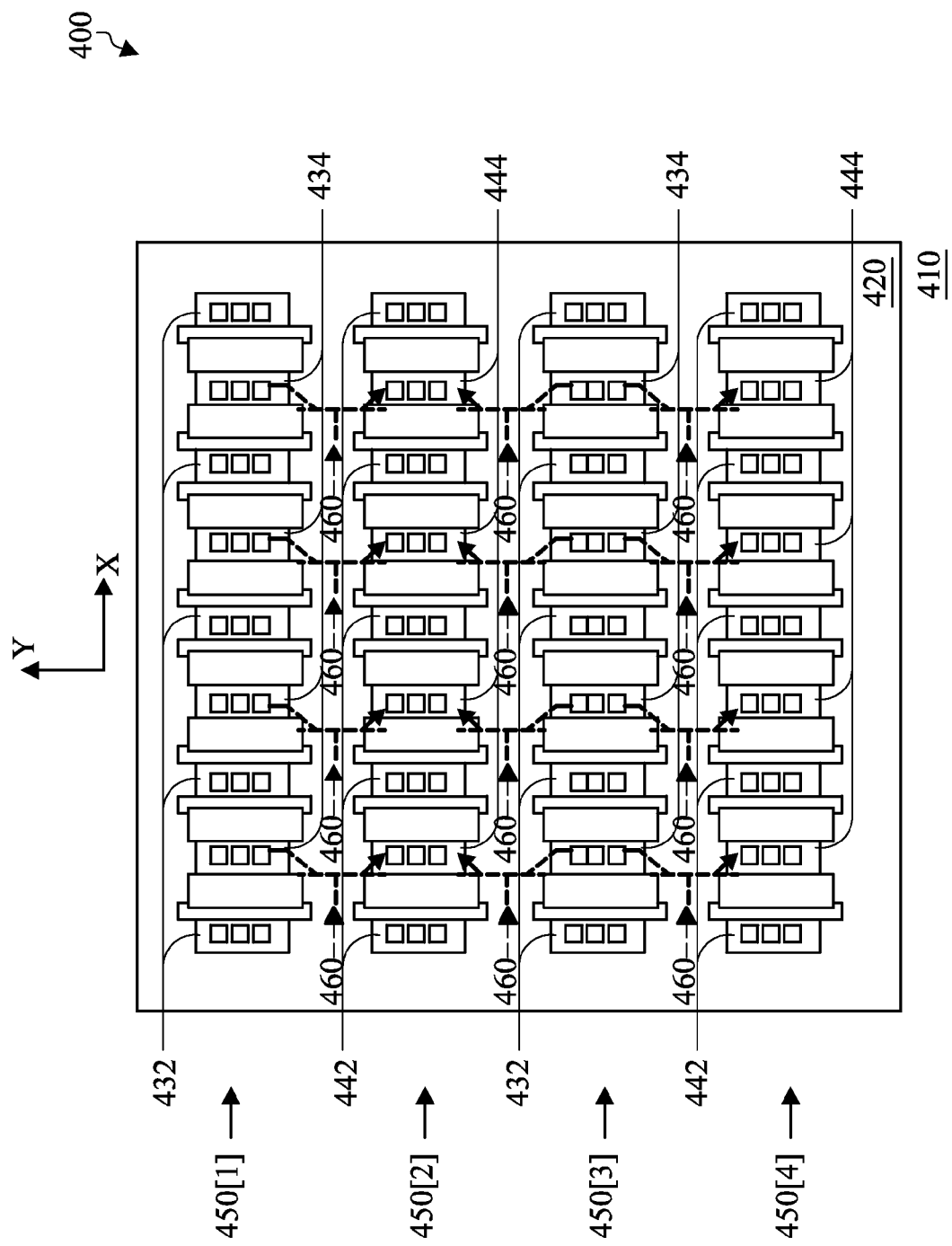
FIG. 4 is a top view of a portion of a semiconductor structure corresponding to another set of ESD protection circuits usable in conjunction with a driver circuit in accordance with some embodiments.

FIG. 4 is a top view of a portion of a semiconductor structure 400 corresponding to another set of ESD protection circuits usable in conjunction with a driver circuit in accordance with some embodiments. In some embodiments, the set of ESD protection circuits includes first ESD protection circuit 120 and second ESD protection circuit 130 in circuit 100.

Semiconductor structure 400 includes a substrate 410 corresponding to substrate 310 and a P-type well region 420 corresponding to well region 320. Semiconductor structure 400 further includes N-type doped regions 432, 434, 442, and 444 in the well region 410.

The N-type doped regions include four subsets of doped regions, where a first and second subsets thereof correspond to a first transistor, such as transistor 122 in FIG. 1; and a third and fourth subsets thereof correspond to a second transistor, such as transistor 132 in FIG. 1. The first subset of the doped regions includes doped regions 432 and is configured as a source region of the first transistor 122. The second subset of the doped regions includes doped regions 434 and is configured a drain region of the first transistor 122. The third subset of the doped regions includes doped regions 442 and is configured as a source region of the second transistor 132. The fourth subset of the doped regions includes doped regions 444 and is configured a drain region of the second transistor 132.

The doped regions are arranged into four rows of doped regions 450[1], 450[2], 450[3], and 450[4] along a channel length direction X. Each odd-ordered row 450[1] and 450[3] includes doped regions of the first and second subsets of the doped regions 432 and 434 without any of the third and fourth subsets of the doped regions 442 and 444. Also, each even-ordered row 450[2] and 450[4] includes the third and fourth subsets of the doped regions 442 and 444 without any of the first and second subsets of the doped regions 432 and 434. A doped region of doped regions 434 is aligned with a corresponding doped region of doped regions 444 in an adjacent row along a channel width direction Y.

Because doped regions 434 and 444 are in the same well region 420, doped regions 432, well region 420, and doped region 444 define corresponding parasitic NPN BJTs 460. In some embodiments, parasitic BJTs 460 collectively correspond to parasitic BJT 160 in FIG. 1. In some embodiments, responsive to various DC biasing conditions of parasitic BJTs 460, the positions of the emitter terminals and the collector terminals thereof are the opposite of those depicted in FIG. 4.

In some embodiments, the doped regions are arranged into two or more rows. Moreover, semiconductor structure 400 includes corresponding gate structures (not labeled) and RPO structures (not labeled) for forming the first and second transistors similar to the gate structures and the RPO structures illustrated in conjunction with FIGS. 3A and 3B. Therefore, the detailed description of the gate structures and the RPO structures are omitted.

Figure 5:
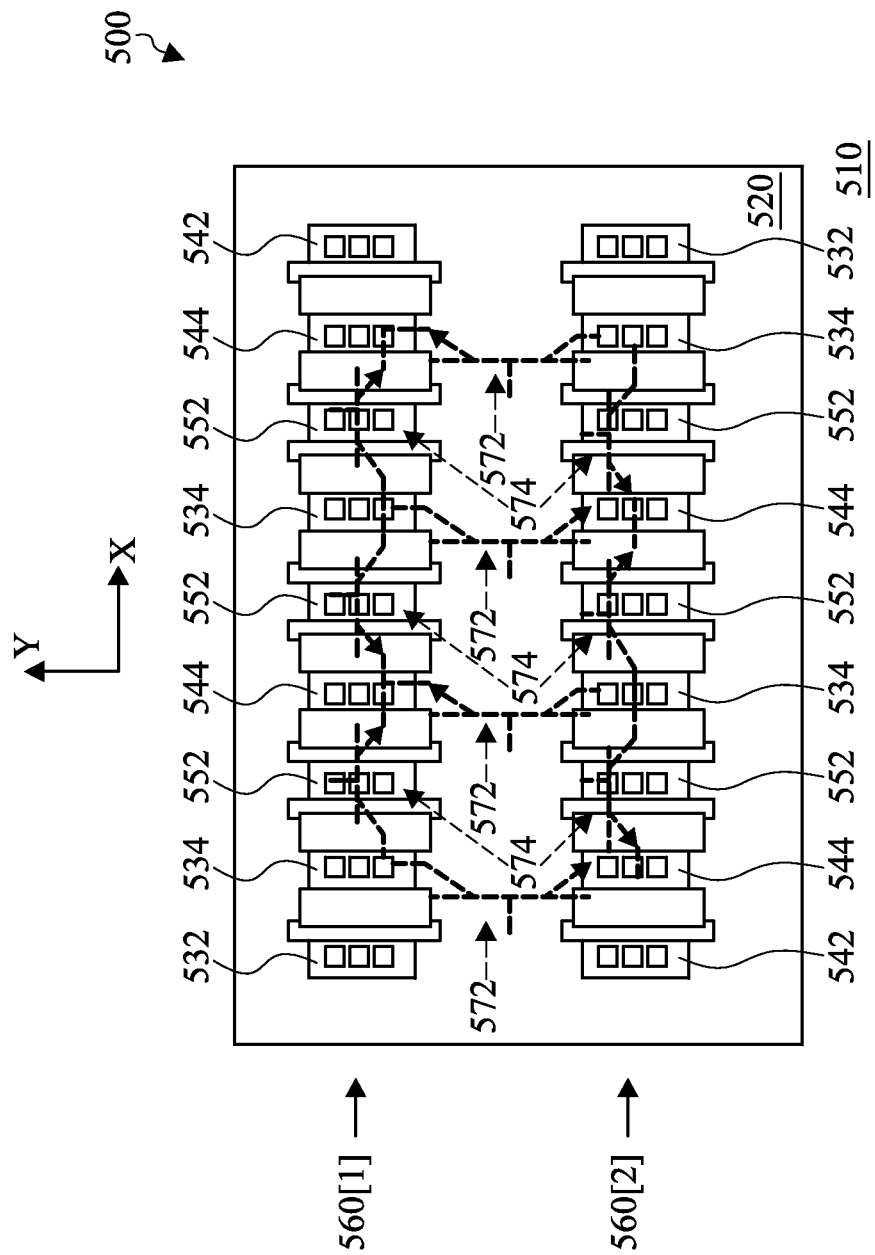
FIG. 5 is a top view of a portion of a semiconductor structure corresponding to yet another set of ESD protection circuits usable in conjunction with a driver circuit in accordance with some embodiments.

FIG. 5 is a top view of a portion of a semiconductor structure 500 corresponding to yet another set of ESD protection circuits usable in conjunction with a driver circuit in accordance with some embodiments. In some embodiments, the set of ESD protection circuits includes first ESD protection circuit 120 and second ESD protection circuit 130 in circuit 100.

Semiconductor structure 500 includes a substrate 510 corresponding to substrate 310 and a P-type well region 520 corresponding to well region 520. Semiconductor structure 500 further includes N-type doped regions 532, 534, 542, 544, and 552 in the well region 510.

The N-type doped regions include four subsets of doped regions, where a first and second subsets thereof correspond to a first transistor, such as transistor 122 in FIG. 1; and a third and fourth subsets thereof correspond to a second transistor, such as transistor 132 in FIG. 1. The first subset of the doped regions includes doped regions 532 and 552 and is configured as a source region of the first transistor 122. The second subset of the doped regions includes doped regions 534 and is configured a drain region of the first transistor 122. The third subset of the doped regions includes doped regions 542 and 552 and is configured as a source region of the second transistor 132. The fourth subset of the doped regions includes doped regions 544 and is configured a drain region of the second transistor 132.

The doped regions are arranged into two rows of doped regions 560[1] and 560[2] along a channel length direction X. Each row 560[1] and 560[2] includes doped regions of the first, second, third, and fourth subsets of the doped regions. A doped region of doped regions 534 is aligned with a corresponding doped region of doped regions 544 in an adjacent row along a channel width direction Y.

Because doped regions 534 and 544 are in the same well region 520, doped regions 532, well region 520, and doped region 544 define corresponding parasitic NPN BJTs 572 and 574. In some embodiments, parasitic BJTs 572 and 574 collectively correspond to parasitic BJT 160 in FIG. 1. In some embodiments, responsive to various DC biasing conditions of parasitic BJTs 572 and 574, the positions of the emitter terminals and the collector terminals thereof are the opposite of those depicted in FIG. 5.

In some embodiments, the doped regions are arranged into two or more rows. Moreover, semiconductor structure 500 includes corresponding gate structures (not labeled) and RPO structures (not labeled) for forming the first and second transistor similar to the gate structures and the RPO structures illustrated in conjunction with FIGS. 3A and 3B. Therefore, the detailed description of the gate structures and the RPO structures are omitted.

Figure 6:
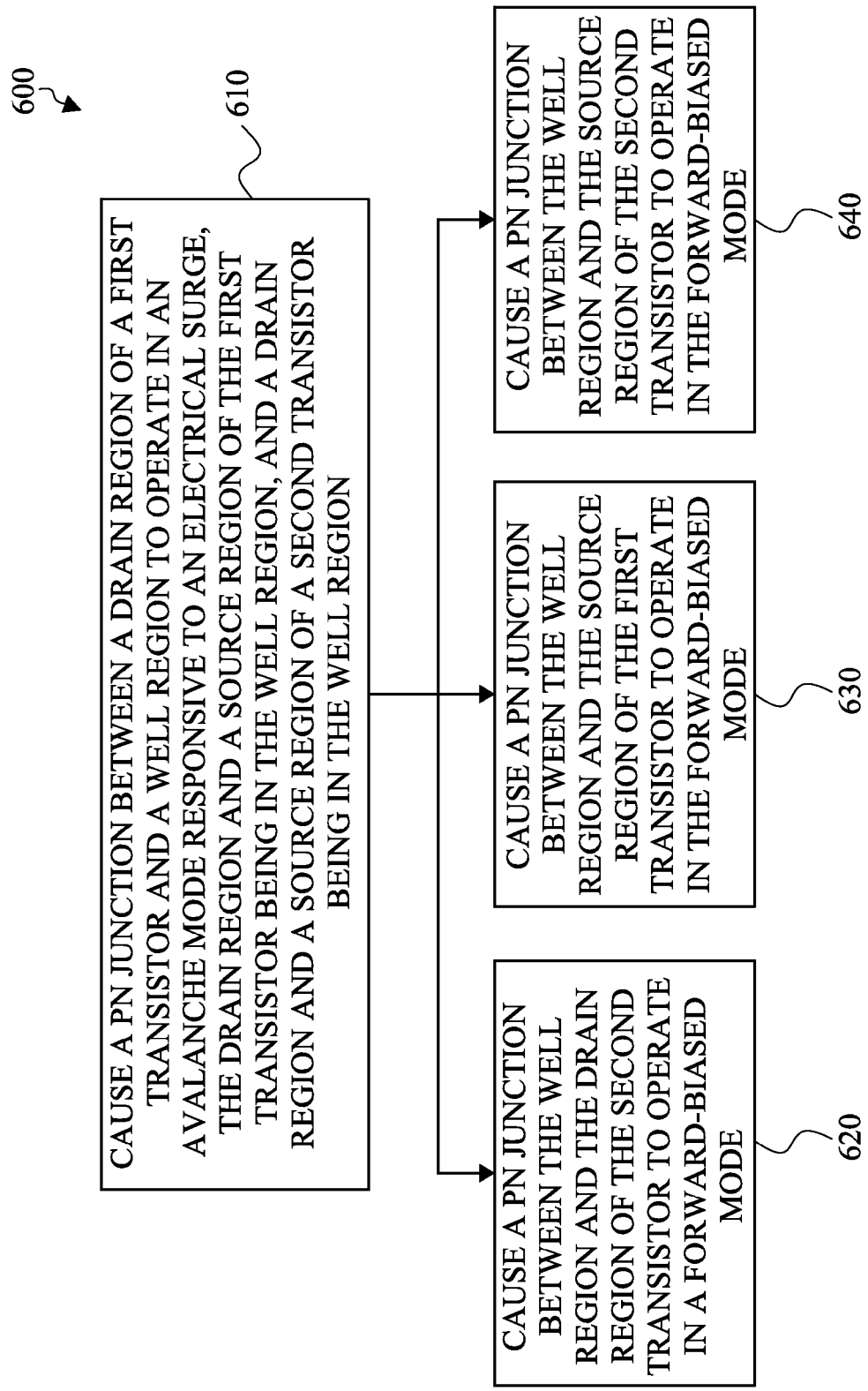
FIG. 6 is a flow chart of a method of electrically coupling output nodes of a driver circuit responsive to an ESD event in accordance with some embodiments.

FIG. 6 is a flow chart of a method 600 of electrically coupling output nodes of a driver circuit responsive to an ESD event in accordance with some embodiments. In some embodiments, method 600 is usable in conjunction with driver circuit 110 and the set of ESD protection circuit 120 and 130 of FIG. 1. It is understood that additional operations may be performed before, during, and/or after the method 600 depicted in FIG. 6, and that some other processes may only be briefly described herein.

The process begins with operation 610, where a PN junction between a drain region (e.g., doped regions 332a and 332c) of a first transistor 122 and a well region (e.g., well region 320) is caused to operate in an avalanche mode responsive to an electrical surge. The drain region of the first transistor 122 is electrically coupled with the first output node 112, and the drain region and a source region of the first transistor 112 are in the well region 320.

In operation 620, a PN junction between the well region 320 and a drain region (e.g., doped regions 334a and 334c) of a second transistor 132 is caused to operate in a forward-biased mode during a time period that the PN junction between the drain region of the first transistor 122 and the well region operates in the avalanche mode. The drain region of the second transistor 132 is electrically coupled with the second output node 114, and, the drain region and a source region of the second transistor 132 are in the well region 320.

In operation 630, a PN junction between the well region 320 and the source region of the first transistor 122 is caused to operate in the forward-biased mode during the time period that the PN junction between the drain region of the first transistor 122 and the well region 320 operates in the avalanche mode.

In operation 640, a PN junction between the well region 320 and the source region of the second transistor 132 is caused to operate in the forward-biased mode during the time period that the PN junction between the drain region of the first transistor 122 and the well region 320 operates in the avalanche mode.

In accordance with one embodiment, a circuit includes a driver circuit between a first power supply node and a second power supply node, a first electrostatic discharge (ESD) protection circuit, and a second ESD protection circuit. The driver circuit includes a first output node and a second output node and is configured to generate a pair of differential signals at the first output node and the second output node. The first ESD protection circuit is coupled between the first output node and the second power supply node. The first ESD protection circuit includes a first transistor of a predetermined type, and the first transistor includes a drain region and a source region in a well region of a first type doping. The second ESD protection circuit is coupled between the second output node and the second power supply node. The second ESD protection circuit includes a second transistor of the predetermined type, and the second transistor includes a drain region and a source region in the well region of the first type doping.

In accordance with another embodiment, a semiconductor structure includes a driver circuit over a substrate, a well region having a first type doping over the substrate, and doped regions of a second type doping in the well region. The driver circuit includes a first conductive structure and a second conductive structure, and the driver circuit is configured to generate a pair of differential signals at the first conductive structure and the second conductive structure. The doped regions include a first subset of the doped regions configured as a source region of a first transistor; a second subset of the doped regions configured as a drain region of the first transistor and electrically coupled with the first conductive structure; a third subset of the doped regions configured as a source region of a second transistor; and a fourth subset of the doped regions configured as a drain region of the second transistor and electrically coupled with the second conductive structure.

In accordance with another embodiment, a method of electrically coupling a first output node and a second output node of a driver circuit responsive to an electrical surge. The method includes causing a PN junction between a drain region of a first transistor and a well region to operate in an avalanche mode responsive to the electrical surge. The drain region of the first transistor is electrically coupled with the first output node, and the drain region and a source region of the first transistor are in the well region. A PN junction between the well region and a drain region of a second transistor is caused to operate in a forward-biased mode during a time period that the PN junction between the drain region of the first transistor and the well region operates in the avalanche mode. The drain region of the second transistor is electrically coupled with the second output node, and the drain region and a source region of the second transistor are in the well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a driver circuit between a first power supply node and a second power supply node, the driver circuit comprising a first output node and a second output node, the driver circuit being configured to generate a pair of differential signals at the first output node and the second output node;
   a first electrostatic discharge (ESD) protection circuit coupled between the first output node and the second power supply node, the first ESD protection circuit comprising a first transistor of a predetermined type, and the first transistor comprising a drain region and a source region in a well region of a first type doping; and
   a second ESD protection circuit coupled between the second output node and the second power supply node, the second ESD protection circuit comprising a second transistor of the predetermined type, and the second transistor comprising a drain region and a source region in the well region of the first type doping.

2. The circuit of claim 1, further comprising doped regions of a second type doping in the well region, wherein:
   a first subset of the doped regions is configured as the source region of the first transistor;
   a second subset of the doped regions is configured as the drain region of the first transistor;
   a third subset of the doped regions is configured as the source region of the second transistor;
   a fourth subset of the doped regions is configured as the drain region of the second transistor;
   the drain region of the first transistor, the well region, and the source region of the first transistor define a first parasitic bipolar junction transistor;
   the drain region of the second transistor, the well region, and the source region of the second transistor define a second parasitic bipolar junction transistor; and
   the drain region of the first transistor, the well region, and the drain region of the second transistor define a third parasitic bipolar junction transistor.

3. The circuit of claim 2, wherein the first parasitic bipolar junction transistor and the second parasitic bipolar junction transistor define a first electrical path, and the third parasitic bipolar junction transistor defines a second electrical path.

4. The circuit of claim 2, wherein the first subset of the doped regions and the third subset of the doped regions have at least one common doped region.

5. The circuit of claim 2, wherein the doped regions are arranged into one or more rows of doped regions, each row of the one or more rows of doped regions comprising doped regions of the first, second, third, and fourth subsets of the doped regions.

6. The circuit of claim 5, wherein
the one or more rows of doped regions comprises a first row and a second row adjacent to the first row;
each row of the first and second rows of doped regions is arranged along a channel length direction;
a doped region of the second subset of the doped regions in the first row is aligned with a doped region of the fourth subset of the doped regions in the second row along a channel width direction.

7. The circuit of claim 2, wherein
the doped regions are arranged into two or more rows of doped regions;
each odd-ordered row of the two or more rows comprises doped regions of the first and second subsets of the doped regions without any of the third and fourth subsets of the doped regions; and
each even-ordered row of the two or more rows comprises doped regions of the third and fourth subsets of the doped regions without any of the first and second subsets of the doped regions.

8. The circuit of claim 7, wherein
each row of the two or more rows of doped regions is arranged along a channel length direction; and
a doped region of the second subset of the doped regions in an odd-ordered row of the two or more rows is aligned with a doped region of the fourth subset of the doped regions in an even-ordered row along a channel width direction, the even-ordered row being adjacent to the odd-ordered row.

9. The circuit of claim 2, wherein the first type doping is a P-type doping, and the second type doping is an N-type doping.

10. A semiconductor structure, comprising:
a driver circuit over a substrate, the driver circuit comprising:
a first conductive structure; and
a second conductive structure, the driver circuit being configured to generate a pair of differential signals at the first conductive structure and the second conductive structure;
a well region over the substrate, the well region having a first type doping; and doped regions of a second type doping in the well region, comprising:
a first subset of the doped regions configured as a source region of a first transistor;
a second subset of the doped regions configured as a drain region of the first transistor and electrically coupled with the first conductive structure;
a third subset of the doped regions configured as a source region of a second transistor; and
a fourth subset of the doped regions configured as a drain region of the second transistor and electrically coupled with the second conductive structure.

11. The circuit of claim 10, wherein the first subset of the doped regions and the third subset of the doped regions have at least one common doped region.

12. The circuit of claim 10, wherein the doped regions are arranged into one or more rows of doped regions, each row of the one or more rows of doped regions comprising doped regions of the first, second, third, and fourth subsets of the doped regions.

13. The circuit of claim 12, wherein
the one or more rows of doped regions comprises a first row and a second row adjacent to the first row;
each row of the first and second rows of doped regions is arranged along a first direction;
a doped region of the second subset of the doped regions in the first row is aligned with a doped region of the fourth subset of the doped regions in the second row along a channel width direction.

14. The circuit of claim 10, wherein
the doped regions are arranged into two or more rows of doped regions;
each odd-ordered row of the two or more rows comprises doped regions of the first and second subsets of the doped regions without any of the third and fourth subsets of the doped regions; and
each even-ordered row of the two or more rows comprises doped regions of the third and fourth subsets of the doped regions without any of the first and second subsets of the doped regions.

15. The circuit of claim 14, wherein
each row of the two or more rows of doped regions is arranged along a channel length direction; and
a doped region of the second subset of the doped regions in an odd-ordered row of the two or more rows is aligned with a doped region of the fourth subset of the doped regions in an even-ordered row along a channel width direction, the even-ordered row being adjacent to the odd-ordered row.

16. The circuit of claim 10, wherein the first type doping is a P-type doping, and the second type doping is an N-type doping.

17. A circuit, comprising:
a first electrostatic discharge (ESD) protection circuit comprising a first transistor; and
a second ESD protection circuit comprising a second transistor, the first ESD protection circuit and the second ESD protection circuit coupled between a first node and a second node of a driver circuit;
wherein a drain region and a source region of the first transistor and a drain region and a source region of the second transistor are in a same well region, and the drain region of the first transistor, the same well region, and the drain region of the second transistor define a first parasitic bipolar junction transistor.

18. The circuit of claim 17, wherein the drain region and the source region of the first transistor and the drain region and the source region of the second transistor are an N-type doping.

19. The circuit of claim 17, wherein the same well region is a P-type well region.

20. The circuit of claim 17, wherein the source region of the first transistor and the source region of the second transistor have at least one common doped region.

\* \* \* \* \*